United States Patent [19]
Proebsting

[11] Patent Number: 5,689,462
[45] Date of Patent: Nov. 18, 1997

[54] PARALLEL OUTPUT BUFFERS IN MEMORY CIRCUITS

[75] Inventor: Robert J. Proebsting, Los Altos Hills, Calif.

[73] Assignee: Townsend and Townsend and Crew, LLP, San Francisco, Calif.

[21] Appl. No.: 577,525

[22] Filed: Dec. 22, 1995

[51] Int. Cl.[6] .................................................. G11C 7/00
[52] U.S. Cl. ........................ 365/189.05; 365/189.02; 365/63
[58] Field of Search ........................... 365/189.05, 63, 365/72, 238.5, 189.01, 189.02

[56] References Cited

U.S. PATENT DOCUMENTS

| | | | |
|---|---|---|---|
| 4,907,203 | 3/1990 | Wada et al. | 365/189.04 |
| 5,027,326 | 6/1991 | Jones | 365/221 |
| 5,073,872 | 12/1991 | Masuda et al. | 365/189.05 |
| 5,285,416 | 2/1994 | Tokami et al. | 365/190 |
| 5,424,982 | 6/1995 | Kato | 365/189.05 |
| 5,434,823 | 7/1995 | Howard | 365/189.05 |

*Primary Examiner*—Tan T. Nguyen
*Attorney, Agent, or Firm*—Townsend and Townsend and Crew LLP

[57] ABSTRACT

A memory circuit with programmable memory array organization and number of data output terminals, capable of connecting unused output buffers in parallel in organizations requiring fewer output terminals than the maximum possible. Parallel connection of output buffers improves output transient performance and employs otherwise dfsabled output buffers to reduce waste of silicon area.

11 Claims, 3 Drawing Sheets

PARALLEL OUTPUT BUFFERS IN MEMORY CIRCUITS

BACKGROUND OF THE INVENTION

The present invention relates in general to integrated circuit memories, and in particular to a memory circuit having multiple organizations.

High density memory integrated circuits such as random access memories (RAMs) are typically characterized by the number of bits of memory and the number of data input/ output (I/O) terminals they provide. For example, a RAM with 16,707,216 bits of memory and one I/O terminal is normally identified as a 16MegX1 RAM. A 16Meg RAM with four I/O terminals is referred to as a 4MegX4 RAM. To provide for various applications requiring different organizations (e.g., X1, X4, X8, or X16), memory chip manufacturers often fabricate a memory circuit with a number of I/O terminals sufficient to accommodate the maximum number of I/Os desired (e.g., X16). The circuit is then programmed at metal mask, or during assembly with bond wires, to obtain a particular number of data I/O terminals. This allows the manufacturer to use the same die to produce memory chips with a variety of organizations (e.g., 4MegX4, 2MegX8, 1MegX16).

There are, however, penalties incurred when using this approach. Each output terminal is driven by an output buffer that is designed to drive the external loading coupled to the I/O pin. Existing memory chips that provide the option of being configured as, for example, a X4, X8, or X16 part, disable the unused output buffers when they are configured with fewer I/O terminals. For example, if such a memory chip is programmed as a X4 part, the remaining twelve output buffers are disabled. Output buffers typically use very large devices to enable the circuit to drive large external capacitive loads. Special layout considerations for the purpose of protection against electrostatic discharge at the pins further add to the already large size of the output buffers. Therefore, in a chip capable of providing a X16 organization, a X4 organization results in the waste of significant amount of silicon area.

Another problem with the existing approach is caused by the fact that the sizes of the driver transistors are fixed regardless of the configuration. The transient performance of the output signal is a function of the effective resistance R, inductance L, and capacitance C associated with the output node. The smallest value of resistance at which the output signal experiences zero overshoot for a given L and C is given by $2*\sqrt{C/L}$ for series connected RLC network. This value is referred to as the critical resistance $R_{cr}$. For a given L and C, an effective output impedance $R_{out}$ greater than $R_{cr}$ causes an overdamping of the output signal, and an $R_{out}$ smaller than $R_{cr}$ causes overshooting of the output signal. Designers select the sizes of the output transistors used in the output buffer circuit to obtain a particular $R_{out}$ that optimizes the transient performance of the output signal. $R_{out}$ is typically made smaller than $R_{cr}$ to obtain a faster rise time resulting in an acceptable amount of overshoot. The transistor sizes are thus based on the effective load inductance and capacitance attendant at the associated I/O pad. However, because the load inductance at an I/O pin is primarily caused by the package lead frame and bond wire connecting to a pad, programming of the I/O pads results in varying effective load inductances for the output buffers in the various organizations. Thus, to provide optimum output signal transient characteristics, the output transistor sizes must vary when changing from, for example, a X16 organization to a X4.

For example, a RAM circuit that provides options for one of X4, X8, or X16 organizations, may have four positive power supply (VDD) pads and four negative power supply (VSS) pads. The 16 output buffers would then be typically grouped in four sets of four buffers each, with each set connecting to a separate power supply pad. In that case, in a X16 organization each group of four active buffers shares the same power supply pads, while in a X4 organization each power supply pad connects to only one active buffer. The voltage e across an inductor is given by L(di/dt). Thus, in a X16 organization where four buffers connect to the same power supply pad experiencing the same di/dt, the equivalent series inductance connected to one of the four buffers is approximately equal to four times the inductance connected to all four buffers. That is, a single, for example, 10 nh inductor coupled to four active output buffers is equivalent to four 40 nh inductors coupled in parallel to four separate output buffers. Thus, assuming a 10 nh inductance per pad, in a X16 organization where all output buffers are active, each buffer would experience an effective inductive load of approximately 50 nh. That includes 10 nh for the associated output pad, and 40 nh caused by the parallel combination of four active output buffers connecting to a single power supply pad. Assuming a capacitive load of, for example, 100 pf, $R_{cr}$ would equal almost 44 ohms.

The same die in a X4 organization would activate one output buffer in each of the four sets of output buffers, with each active output buffer connecting to a separate VDD and VSS pad. This arrangement, however, results in an effective inductive load of approximately 20 nh for each output buffer (10 nh for the output pad and 10 nh for the power supply pad). Thus, $R_{cr}$ for the buffers in the X4 organization would equal approximately 28 ohms. Accordingly, if the sizes of the output transistors are optimized for the X16 organization, the output signal would exhibit overdamping when the chip is configured in a X4 organization. Conversely, if the sizes of the output transistors are optimized for the X4 organization, the output signal would exhibit increased overshoot when the chip is configured in a X16 organization.

There is therefore a need for an improved output buffering circuit in memory circuits that provide assembly options for various output organizations.

SUMMARY OF THE INVENTION

The present invention provides a circuit and a method for paralleling output buffers in memory circuits that provide assembly options for various output organizations. The paralleling of output buffers according to the present invention reduces the waste of silicon area and improves the output signal transient characteristics for the various organizations. Multiplexers programmably connect one of a predetermined number of global output lines to an input of each output buffer. The output buffers are selectively connected in parallel at metal mask or assembly, coupling one or more output pads to a single pin. Logic is provided to control the multiplexers for routing the appropriate output signal to one or more of the output buffers.

Accordingly, in one embodiment, the present invention provides in a memory circuit that is programmable to provide n or 2n output terminals, a method for configuring the circuit output organization including the steps of: (a) providing 2n output buffers each having an output coupled to one of 2n pins, respectively, for a X2n organization; and (b) coupling in parallel pairs of the 2n output buffers with outputs of each pair coupled to n pins, for a Xn organization.

In another embodiment, the present invention provides in a memory circuit that is programmable to provide n or 2n output terminals, an output circuit including: 2n output buffers each having an input terminal and an output terminal, 2n global output lines for carrying output data, multiplexing means for selectively coupling the 2n global output lines to the 2n output buffers, and control logic coupled to the multiplexing means for routing selected global output lines to selected output buffers in response to chip organization data and address data.

A further understanding of the nature and advantages of the present invention may be had with reference to the following detailed description and drawings.

DESCRIPTION OF THE PREFERRED EMBODIMENT

Figure 1:
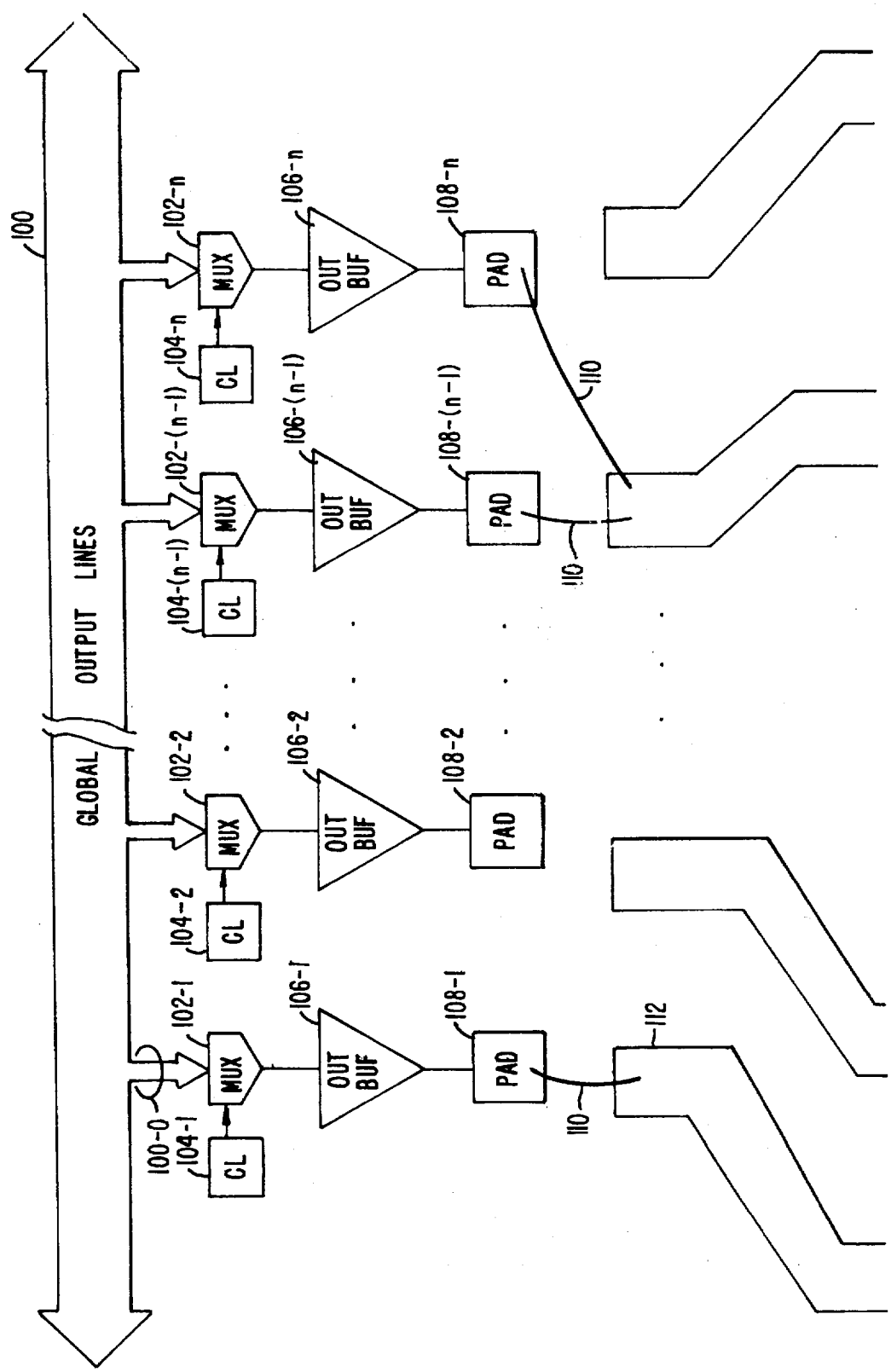
FIG. 1 is a block diagram of the parallel output buffer circuit of the present invention.

Referring to FIG. 1, there is shown a block diagram of the circuit implementing the improved output buffer organization according to the present invention for a memory circuit with n output terminals. The memory circuit has n global output lines 100, selected subsets of which feed into n multiplexers (MUXes) 102. Each MUX 102 receives control signals from an associated control logic 104. In response to the control signals from control logic 104, MUXes 102 route one of the global output lines selected from the subset of the global output lines 100 to an input of an output buffer 106. There are n output buffers 106, each having an output connecting to a corresponding output pad 108. Control logic 104 receives programming information and controls MUXes 102 to route the appropriate global output line to the corresponding output buffer 106. Next, depending on the programmed organization, wire bonds 110 either connect a single output pad to a lead connector 112 as shown for pad 108-1, or do not connect an output pad at all (e.g., output pad 108-2), or connect two output buffers in parallel by connecting two output pads to a single lead connector 112, as shown for output pads 108-(n-1) and 108-n. A lead connector 112 leads the signal through the package and onto the external pin. In the case of paralleled output buffers, the corresponding MUXes route the same global output line to the inputs of the output buffers. This doubles the drive capability while reducing the effective output impedance by one half.

Figure 2:
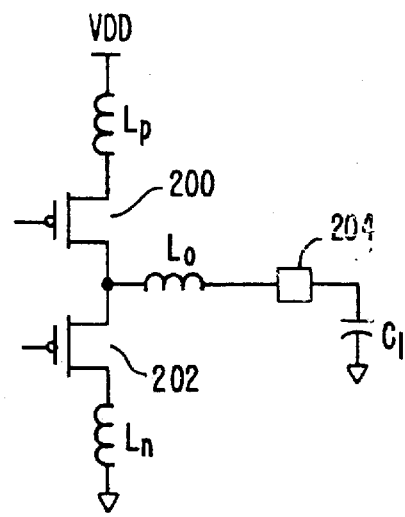
FIG. 2 illustrates the output transistors in an exemplary output buffer and it's effective inductive/capacitive loading.

The circuit shown in FIG. 1 ameliorates both of the problems associated with the prior art memory circuits that have programmable organization, namely the wasted silicon area and the non-optimized output impedance characteristics. The improvement with respect to the output impedance characteristics will be explained hereinafter in connection with FIG. 2. Referring to FIG. 2, there is shown an exemplary output stage for a CMOS output buffer. The buffer includes a PMOS pull-up transistor 200 and an NMOS pull-down transistor 202 with a common node driving the output pad 204. The circuit also shows the parasitic inductances that appear at all nodes that connect to a pad. Thus, there is an inductor Lp that couples PMOS 200 to the positive power supply VDD, an inductor Ln that couples NMOS 202 to the negative power supply VSS or ground, and an inductor Lo that couples the output node to output pad 204. A capacitor C1 connects to output pad 204 and approximates the effective load capacitance for the buffer.

If n in FIG. 1 is equal to 16 (i.e., the memory circuit can have a maximum of 16 outputs), the circuit includes 16 buffers. The 16 buffers are typically organized in four groups of four, with each group connecting to a separate set of power supply pads. Prior art output-programmable memory circuits activate all 16 buffers connecting to their respective power supply pads in a X16 organization, and activate a single buffer from each group of four connecting to it's respective and separate power supply pad for a X4 organization. As described in the background section, this results in varying Rcr requirements for each buffer, forcing an undesirable compromise in the output transient characteristics of each buffer when going from one organization to another. More specifically, given a parasitic inductance value of, for example, 10 nh for each pad, and a capacitive load of, for example, 100 pf, it was approximated that the Rcr for a buffer in a X16 organization would equal 44 ohms, while the Rcr for the same buffer in a X4 organization would equal 28 ohms.

With the circuit of the present invention as shown in FIG. 1, it is possible to substantially reduce the variance in the Rcr in the different output organizations. In a X16 organization, each buffer would still have to be activated and separately connected to it's output pad. Thus, the Rcr value for the effective output impedance of each buffer would remain at approximately 44 ohms in a X16 organization. In a X4 organization, however, the manufacturer has the option of connecting otherwise unused output buffers in parallel with active buffers. Output buffers 106-(n-1) and 106-n are shown in FIG. 1 as connected in parallel. Two bond wires 110 connect pads 108-(n-1) and 108-n to the same lead connector 112, leading to the same pin once the circuit is packaged. Control logic blocks 104-(n-i) and 104-n control MUXes 102-(n-i) and 102-n to route the same global output line 100 to the inputs of both output buffers 106-(n-1) and 106-n. The parallel combination of the two inductances associated with bond wires 110 results in reduced overall effective load inductance Lo. Thus, the value of Lo for the combined buffer is reduced from 10 nh to, for example, 6 nh. With a 10 nh Lp, a 6 nh Lo, and a 100 pf C1, the value of Rcr equals approximately 25 ohms. However, because of the parallel connection of the two output buffers, the actual output impedance of the combined buffer is given by the output impedance of two PMOS transistors 200 in parallel. Thus, the size of each PMOS transistor 200 can be designed for an output impedance twice that required by the Rcr. In this example, a single PMOS 'transistor 200 can have an output impedance of approximately 50 ohms, such that when placed in parallel with another PMOS transistor 200, the effective output impedance would equal 25 ohms.

The ability to combine two output buffers in parallel, therefore, allows for the use of individual output buffers with driver transistors having larger output impedances than would otherwise be required for a X4 organization. When the same circuit is configured in a X16 Organization, the output impedance would be the larger value, in this example 50 ohms. This is much closer to the Rcr required in a X16 organization (44 ohms) than the prior art 28 ohm impedance. Therefore, variations in the transient characteristics of the output signals are substantially reduced when the memory circuit is programmed in different output organizations, resulting in improved performance of the circuit in the various organizations.

In addition to improving the output transient performance, the circuit and methodology of the present invention clearly reduces waste in silicon area. When the circuit is organized to have a fewer number of outputs than the maximum available, a number of buffers that were previously permanently disabled and unused, are now connected and provide for additional drive capability as well as improved transient performance.

Figure 3:
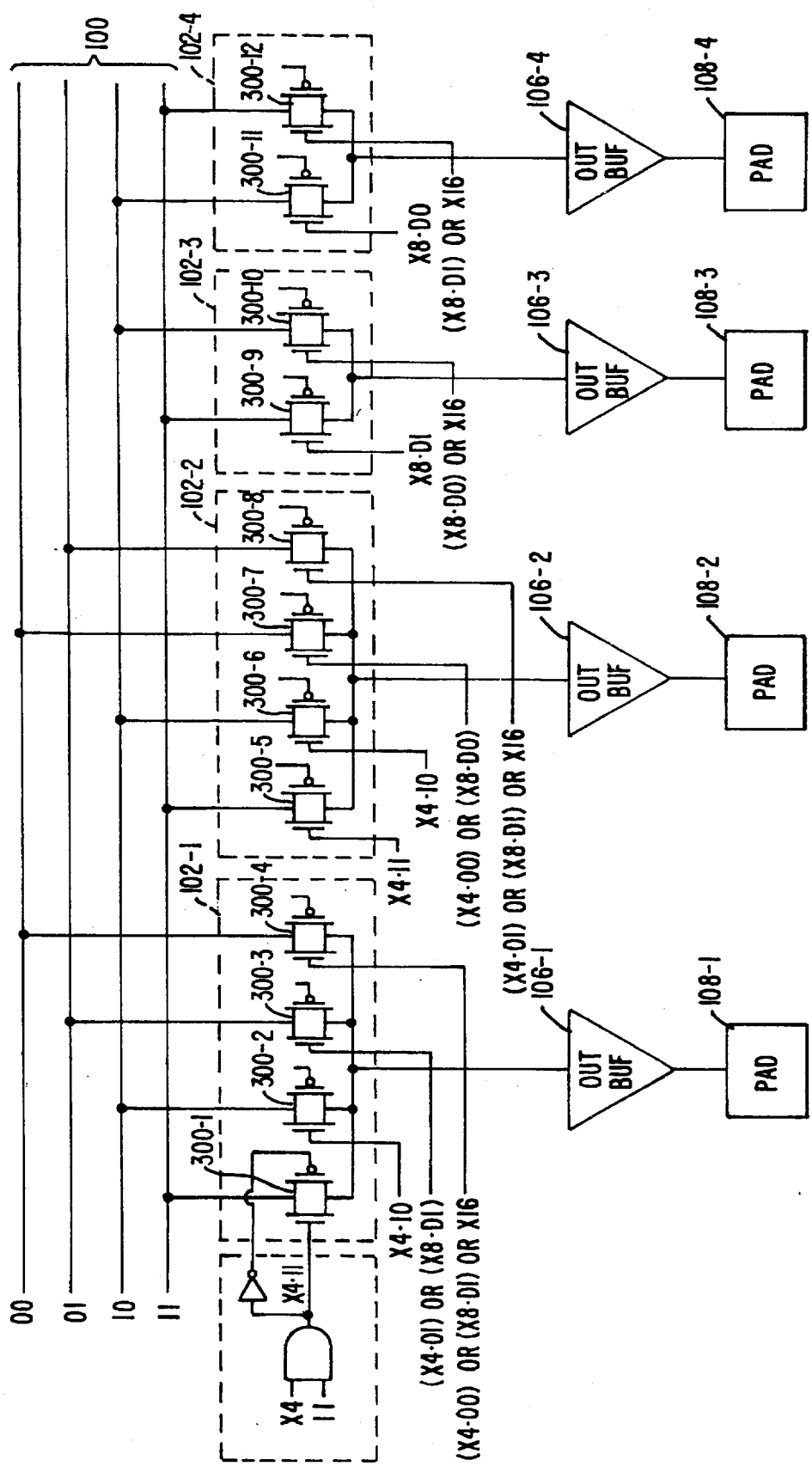
FIG. 3 shows a section of the parallel output circuit of the present invention in greater detail.

FIG. 3 shows in greater detail a section of the parallel output circuit according to the present invention for an exemplary embodiment. The exemplary embodiment is a memory circuit that provides options for X16, X8, and X4 organizations. It is to be understood that the principle teachings of the present invention can be readily applied to memory circuits with organizations other than the exemplary embodiment described herein. FIG. 3 illustrates the detailed circuitry for one fourth of the output circuit. The circuit schematic shows four of the 16 global output lines 100, four MUXes 102, four output buffers 106, and four pads 108. The binary combination of two externally supplied address bits identify each one of the four global output lines. Each MUX 102 receives various combinations of the four global output lines at four inputs. MUX 102 is made up of transmission gates 300 with each transmission gate 300 including a pair of NMOS and PMOS transistors. The output terminals of all transmission gates 300 connect together and form the single output of MUX 102. The output of each MUX 102 connects to an input terminal of a corresponding output buffer 106. The gate terminals of the NMOS/PMOS pair in each transmission gate 300 receive the programming logic in a complementary fashion. The terminology X4·11, for example, denotes a logical AND operation between the programming signal X4 (indicating a X4 organization) and binary address for global output line 11. That is, the control logic for the transmission gate 300-1 is an AND gate which receives X4 and the two address bits that select one of the four global output lines. Thus, when both address lines are asserted, transmission gate 300-1 in MUX 102-1 connects global output line 11 to output buffer 106-1 in a X4 organization. Similarly, transmission gate 300-2 connects global line 10 to output buffer 106-1 in a X4 organization, when only the most significant bit of the two-bit address is asserted high. Transmission gate 300-3 connects global line 01 to output buffer 106-1 under two different conditions: (1) in a X4 organization when only the least significant address bit is asserted (X4·01), or (2) in a X8 organization when the least significant bit is asserted regardless of the state of the most significant address bit (X8·D1, where D denotes a "don't care" state). Finally, transmission gate 300-4 connects global output line 00 to output buffer 106-1 under three different conditions: (1) in a X4 organization when neither address bit is asserted (X4·00), or (2) in a X8 organization whenever the least significant address bit is deasserted (X8·D0), or (3) always connected in a X16 organization. The remaining MUXes are similarly controlled to selectively connect various combinations of the output global lines to the various output buffers as shown.

To better understand the operation of the circuit of FIG. 3, the resulting output configuration for each of the three organizations will be described hereinafter in connection with FIG. 4. The logic signals X4, X8, and X16 are generated by a logic block (not shown in any of the diagrams) that receives two bits of programming data. When asserted high, each one of these signals indicates that the circuit is programmed in the particular organization. The manufacturer programs the circuit by connecting the two programming bits to VDD or VSS (or ground) either by modifying a metal mask during the final stages of fabrication, or by using bond wires that connect two programming pads to the power supplies.

Figure 4A:
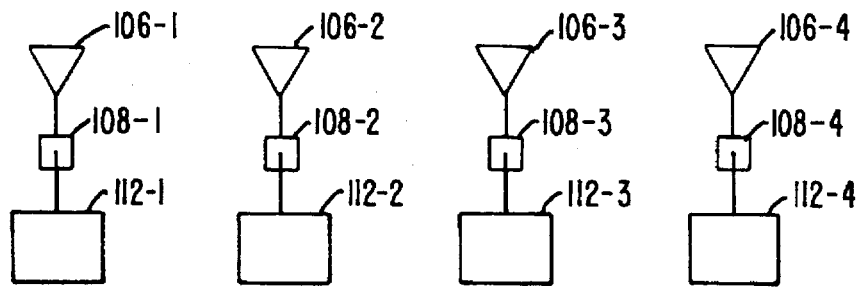
FIGS. 4A, 4B, and 4C illustrate one example of various wire bonding options for different memory organizations.

Referring to FIG. 3 and starting from the X16 organization, the programming signals X4 and X8 are at a logic low level, while X16 is at logic high level. Transmission gates 300-4, 300-8, 300-10, and 300-12 in MUXes 102-1, 102-2, 102-3, and 102-4, respectively, connect global output lines 00, 01, 10, and 11 to output buffers 106-1, 106-2, 106-3, and 106-4, respectively. Accordingly, all 16 buffers are active and the output of each is bond wired to a separate lead connector 112 leading to a separate data output pin. The X16 organization for a group of four buffers is schematically illustrated in FIG. 4A.

Figure 4B:
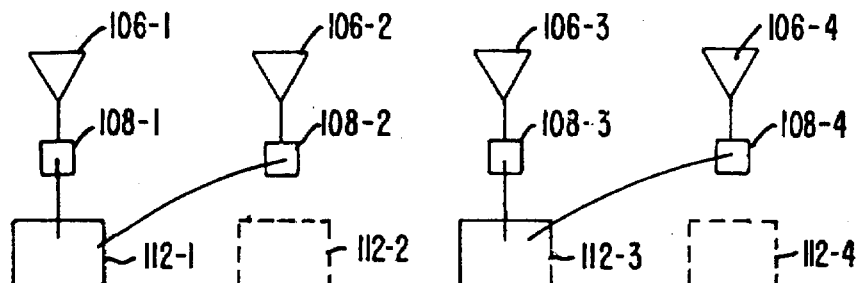

In a X8 organization, programming signal X8 is high, signals X4 and X16 are low, and there are eight global output lines. When the least significant bit is high, transmission gates 300-3 and 300-8 connect global output line 01 to buffers 106-1 and 106-2, respectively. Similarly, transmission gates 300-9, and 300-11 connect global output line 11 to output buffers 106-3 and 106-4, respectively. The output pads connecting to the outputs of buffers 106-1 and 106-2 are both bond wired to the same lead connector 112-1 leading to a single data output pin. This places buffers 106-1 and 106-2 in parallel. Two other bond wires place buffers 106-3 and 106-4 in parallel by connecting the outputs of each to the same lead connector 112-3. As shown in FIG. 4B, in this organization, each of two lead connectors receives the outputs of two paralleled buffers. In a similar fashion, when the least significant address bit is low, buffers 106-1 and 106-2 drive, in parallel, global output line 00, while output buffers 106-3 and 106-4 drive, in parallel, global output line 10. Thus, in a X8 organization all buffers are active and help drive memory global output lines. In this organization, lead connectors 112-2 and 112-4, shown with broken lines, no longer exist.

Figure 4C:
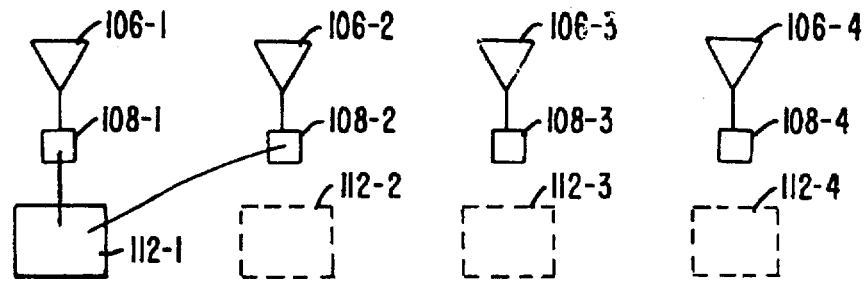

In a X4 organization, signal X4 is high, signals X8 and X16 are low, and there are four global output lines. In the exemplary quadrant shown in FIG. 3, only two of the output buffers are utilized in this organization. Thus, only MUXes 102-1 and 102-2 receive the X4 signal. Depending on the binary value of the two address bits, transmission gates 300-1 through 300-4 and 300-5-300-8 route the same one of the global output lines to output buffers 106-1 and 106-2. The outputs of these buffers are then paralleled by bond wires as shown in FIG. 4C.

Thus, the present invention provides a technique and a circuit for connecting output buffers in parallel in a memory circuit with programmable output organizations, that improves the output transient characteristics and reduces waste of silicon area. While the above is a complete description of specific embodiments of the present invention, various modifications, variations and alternatives may be employed. The scope of this invention, therefore, should not be limited to the embodiments described, and should instead be defined by the following claims.

What is claimed is:

1. In a memory circuit having $2^n$ output terminals where n is a programmable integer, a method for configuring the circuit output organization comprising the steps of:
   (a) providing $2^m$ output buffers, where m is equal to a maximum value of n;
   (b) coupling an output of each one of said $2^m$ output buffers to $2^m$ pins, respectively, for a $X2^m$ organization;

(c) coupling in parallel selected ones of said $2^m$ output buffers to form one or more sets of parallel output buffers, with an output of each set coupling to a corresponding pin, for a $X2^k$ organization, where k is an integer less than m.

2. The method of claim 1 wherein said step of coupling in parallel comprises the steps of:

(d) programming inputs of at least two output buffers to couple to a single memory output line; and (e) wire bonding outputs of said at least two output buffers to a single lead connector to form a set of parallel output buffers.

3. The method of claim 2 wherein n can be programmed to equal one of 2, 3, or 4, to obtain X4, X8, or X16 organizations, respectively.

4. In a memory circuit that can be programmed to have four, eight, or sixteen output terminals in X4, X8, or X16 organizations, respectively, a method for improving output performance comprising the steps of:

(a) providing sixteen output buffers;

(b) coupling an output of each one of said sixteen output buffers to a separate pin in a X16 organization;

(c) coupling said sixteen output buffers in eight pairs of paralleled buffers, with each pair having a common output coupled to a separate pin in a X8 organization; and (d) coupling a selected eight of said sixteen output buffers in four pairs of paralleled buffers, with each pair having a common output coupled to a separate pin in a X4 organization.

5. In a memory circuit having $2^n$ output terminals, where n is an integer that can be programmed by application of output organization programming information, an output circuit comprising:

$2^m$ output buffers, where m is a maximum value of n, each output buffer having an input and an output;

$2^m$ multiplexers, each having a control input, a plurality of data inputs and an output, said plurality of data inputs coupling to a selected plurality of memory output lines, and said output of each multiplexer coupling to an input of an output buffer, respectively; and control logic having inputs for receipt of the programming information, and outputs coupled to said $2^m$ multiplexer control inputs, wherein, said $2^m$ multiplexers are (i) programmed to couple every one of $2^m$ memory output lines to $2^m$ inputs of said $2^m$ output buffers, respectively, in a $X2^m$ organization, and (ii) programmed to couple every one of $2^k$ memory output lines to inputs of at least two output buffers, in a $X2^k$ organization, where k is smaller than m.

6. The output circuit of claim 5 wherein said multiplexers comprise a plurality of transmission gates each having a first current-carrying terminal and a second current carrying terminal and a control terminal, and wherein said multiplexer control input couples to said control terminal, said first terminals couple to said multiplexer output, and said second terminals couple to said plurality of data inputs, respectively.

7. The output circuit of claim 5 wherein the output organization programming information includes at least one manufacturer-programmable output organization bit and at least one output line address bit.

8. The output circuit of claim 5 wherein each one of said $2^m$ output buffers comprises a pull-up transistor and a pull-down transistor having a common node coupled to said output of said output buffer.

9. The output circuit of claim 5 wherein m equals sixteen and the memory circuit is programmed to have one of four, eight, and sixteen output terminals in X4, X8, and X16 organizations, respectively.

10. A memory circuit comprising:

a plurality of output lines carrying memory output data;

a plurality of output buffers, each having an input and an output;

selection means for selectively coupling said plurality of output lines to said inputs of said plurality of output buffers;

control logic coupled to said selection means for controlling said selection means in response to output organization data; and a plurality of output pads coupled to said outputs of said plurality of output buffers, respectively, wherein, when the memory circuit is programmed with maximum number of output terminals, each output buffer drives a separate output line to a separate pad bond wired to a separate lead connector, and when the memory circuit is programmed with a smaller number than said plurality of output buffers, selective ones of said plurality of output buffers are coupled in parallel.

11. The memory circuit of claim 10 wherein said selection means selectively couples a single output line to more than one output buffer, and corresponding pads of said more than one output buffer are bond wired to a single lead connector, thereby coupling selected ones of said plurality of output buffers in parallel.

* * * * *